(12) United States Patent
Liao et al.

(10) Patent No.: US 12,235,553 B2
(45) Date of Patent: Feb. 25, 2025

(54) ARRAY SUBSTRATE AND DISPLAY PANEL

(71) Applicants: Beijing BOE Display Technology Co., Ltd., Beijing (CN); BOE TECHNOLOGY GROUP CO., LTD., Beijing (CN)

(72) Inventors: Yanping Liao, Beijing (CN); Maoxiu Zhou, Beijing (CN); Yingmeng Miao, Beijing (CN); Haipeng Yang, Beijing (CN); Li Tian, Beijing (CN); Zhihua Sun, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 584 days.

(21) Appl. No.: 17/622,205

(22) PCT Filed: Dec. 4, 2020

(86) PCT No.: PCT/CN2020/134055
§ 371 (c)(1),
(2) Date: Dec. 22, 2021

(87) PCT Pub. No.: WO2022/116198
PCT Pub. Date: Jun. 9, 2022

(65) Prior Publication Data
US 2023/0258989 A1     Aug. 17, 2023

(51) Int. Cl.
*H01L 27/12*     (2006.01)
*G02F 1/1343*     (2006.01)
(Continued)

(52) U.S. Cl.
CPC .. *G02F 1/136286* (2013.01); *G02F 1/134345* (2021.01); *G02F 1/1368* (2013.01);
(Continued)

(58) Field of Classification Search
CPC ......... G02F 1/136286; G02F 2201/121; G02F 2201/123; G02F 2201/52; H01L 27/124;
(Continued)

(56) References Cited

U.S. PATENT DOCUMENTS 8,736,522 B2 *   5/2014   Taneda ................. G09G 3/3233
                                                                                                                       345/76
9,252,159 B2     2/2016   Liu et al.
(Continued)

FOREIGN PATENT DOCUMENTS

CN            101442056 A      5/2009
CN            102929060 A      2/2013
(Continued)

OTHER PUBLICATIONS

Written Opinion for International Application No. PCT/CN2020/134055 mailed Sep. 6, 2021.

*Primary Examiner* — Eduardo A Rodela
(74) *Attorney, Agent, or Firm* — Perilla Knox & Hildebrandt LLP; Kenneth A. Knox

(57) ABSTRACT

An array substrate and a display panel are described. The array substrate may include a first base; a plurality of pixel units arrayed on the first base in a row direction and a column direction; each of the pixel units comprising at least two sub-pixels arranged in the row direction; a plurality of first scanning lines sequentially arranged on the first base in the column direction, at least one first scanning line being arranged at a side of each row of pixel units in the column direction, the first scanning lines being connected with the sub-pixels; and a plurality of second scanning lines sequentially arranged on the first base in the row direction, at least one second scanning line being arranged at a side of each column of pixel units in the row direction.

20 Claims, 8 Drawing Sheets

(51) Int. Cl.
*G02F 1/1362* (2006.01)
*G02F 1/1368* (2006.01)

(52) U.S. Cl.
CPC ...... *H01L 27/124* (2013.01); *G02F 2201/121* (2013.01); *G02F 2201/123* (2013.01); *G02F 2201/52* (2013.01)

(58) Field of Classification Search
CPC .. H10K 59/123; H10K 59/131; H10K 59/179; H10K 59/82; H10K 59/84; H10K 59/86
See application file for complete search history.

(56) References Cited

U.S. PATENT DOCUMENTS

| | | | |
|---|---|---|---|
| 9,349,783 B2 * | 5/2016 | Kim | H10K 59/131 |
| 9,933,678 B1 | 4/2018 | Chen et al. | |
| 10,720,450 B2 | 7/2020 | Wang | |
| 10,950,174 B2 * | 3/2021 | Kim | H10K 59/1213 |
| 11,372,301 B2 * | 6/2022 | Ahn | G02F 1/13456 |
| 2014/0138718 A1 | 5/2014 | Liu et al. | |
| 2015/0009106 A1 * | 1/2015 | Lee | G09G 3/3233 |
| | | | 345/77 |
| 2015/0190730 A1 * | 7/2015 | Govindan | B01F 23/20 |
| | | | 261/152 |
| 2015/0293413 A1 | 10/2015 | Aoyama et al. | |
| 2018/0294282 A1 | 10/2018 | Wang | |

FOREIGN PATENT DOCUMENTS

| | | |
|---|---|---|
| CN | 103135298 A | 6/2013 |
| CN | 102681224 B | 6/2015 |
| CN | 105372891 A | 3/2016 |
| CN | 103135298 B | 9/2016 |
| CN | 106229319 A | 12/2016 |
| CN | 105372891 B | 3/2019 |
| EP | 3343283 A1 | 7/2018 |
| JP | 2019211568 A | 12/2019 |

* cited by examiner

ARRAY SUBSTRATE AND DISPLAY PANEL

CROSS-REFERENCE TO RELATED APPLICATION

The present application is a national phase application under 35 U.S.C. 371 of International Application No. PCT/CN2020/134055 filed Dec. 4, 2020, the contents of which being incorporated by reference in their entirety herein.

TECHNICAL FIELD

The present disclosure relates to the technical field of display and, in particular, to an array substrate and a display panel.

BACKGROUND

With the popularization of the application of a full-screen concept in small and medium-sized display products, the large-sized display product (such as a television) is also required to have a perfect fashion appearance. The television has gradually become "borderless", and the full-screen concept has also become a new development direction of the television market. However, the large-size full screen display product currently has some image quality problems such as Mura (i.e., uneven brightness).

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

An objective of the present disclosure is to provide an array substrate and a display panel, which can reduce the image quality problems such as the Mura problem existing in the product and improve the product quality.

A first aspect of the present disclosure provides an array substrate. The array substrate includes:

a first base;

a plurality of pixel units arrayed on the first base in a row direction and a column direction; each of the pixel units comprising at least two sub-pixels arranged in the row direction;

a plurality of first scanning lines sequentially arranged on the first base in the column direction, at least one first scanning line being arranged at a side of each row of pixel units in the column direction, the first scanning lines being connected with the sub-pixels; and a plurality of second scanning lines sequentially arranged on the first base in the row direction, at least one second scanning line being arranged at a side of each column of pixel units in the row direction; wherein the second scanning line has a scanning signal input terminal and is connected with the first scanning line through a first via hole structure.

In an exemplary embodiment of the present disclosure, the array substrate further includes:

a plurality of data lines sequentially arranged on the first base in the row direction, the data line being connected with the sub-pixels; wherein the data line is arranged on at least one side of each column of sub-pixels in the row direction; and a plurality of first common lines sequentially arranged on the first base in the column direction, the first common line being connected with the sub-pixels, wherein at least one first common line is arranged at a side of each row of pixel units in the column direction.

In an exemplary embodiment of the present disclosure, each of the sub-pixels includes:

a sub-pixel electrode having a plurality of first electrode strips arranged at intervals in the row direction;

a common electrode arranged in the same layer as the sub-pixel electrode, the common electrode having a plurality of second electrode strips arranged at intervals in the row direction, and the second electrode strips and the first electrode strips being arranged alternately in the row direction; the common electrode being connected with the first common line through a second via hole structure; and a transistor comprising a gate, an active layer, and a first electrode and a second electrode arranged in the same layer; the gate being connected with the first scanning line; the first electrode being connected with an end of the active layer, and the first electrode being connected with the data line; the second electrode being connected with the other end of the active layer and connected with the sub-pixel electrode.

In an exemplary embodiment of the present disclosure, the first via hole structure comprises a first via hole portion and a connecting portion, the connecting portion and the second scanning line are located in different layers of the array substrate, and a part of the connecting portion is connected with the first scanning line and a part of the connecting portion is connected with the second scanning line through the first via hole portion.

In an exemplary embodiment of the present disclosure, the first via hole structure further comprises a second via hole portion; wherein the connecting portion is arranged in the same layer as the common electrode and the sub-pixel electrode, and there is a gap between the connecting portion and the common electrode and the sub-pixel electrode; and the connecting portion is connected with the first scanning line through the second via hole portion.

In an exemplary embodiment of the present disclosure, the first scanning line is provided with a plurality of hollowed-out holes;

wherein an orthographic projection of the second via hole portion on the first base partially overlaps with an orthographic projection of the first scanning line on the first base, and the orthographic projection of the second via hole portion on the first base partially overlaps with an orthographic projection of the hollowed-out hole on the first base.

In an exemplary embodiment of the present disclosure, the first base has a plurality of pixel areas arrayed in the row direction and the column direction and a plurality of first wiring areas;

wherein each of the pixel areas comprises at least two sub-pixel areas arranged at intervals in the row direction, the number of sub-pixel areas in each of the pixel areas is equal to the number of sub-pixels in each of the pixel units, and the first electrode strip and the second electrode strip in each of the sub-pixels are arranged on one sub-pixel area; and wherein the first wiring areas and columns of pixel areas are alternately arranged in the row direction, a part of the plurality of first wiring areas is a first sub-wiring area, and the other part thereof is a second sub-wiring area, one of the first sub-wiring area and the second sub-wiring area is provided with at least one second scanning line, and the other of the first sub-wiring area and the second sub-wiring area is provided with one second scanning line.

In an exemplary embodiment of the present disclosure, each of the first sub-wiring areas is provided with two second scanning lines, and two second scanning lines on the same first sub-wiring area are respectively connected with different first scanning lines through the first via hole structure;

wherein each of the second sub-wiring areas is provided with one second scanning line.

In an exemplary embodiment of the present disclosure, the array substrate also comprises a plurality of second common lines, and each of the second common lines is connected with the common electrode through a third via hole structure;

wherein the second sub-wiring area is provided with one second scanning line and one second common line.

In an exemplary embodiment of the present disclosure, the first base has a plurality of second wiring areas, the second wiring areas and rows of pixel areas are alternately arranged in the column direction, and each of the second wiring areas is provided with one first scanning line and one first common line;

wherein the first scanning line in one row is connected with the gates of the transistors of the sub-pixels in the same row, and the first common line in one row is connected with the common electrodes of the sub-pixels of the same color in the same row through the second via hole structure.

In an exemplary embodiment of the present disclosure, two second scanning lines are respectively connected with the same first scanning line through one first via hole structure.

In an exemplary embodiment of the present disclosure, the plurality of first wiring areas are divided into a plurality of first wiring area groups, and each of the first wiring area groups comprises 8 first wiring areas arranged sequentially in the row direction, a $n^{th}$ first wiring area in each of the first wiring area groups is formed into the first sub-wiring area, and the remaining 7 first wiring areas are formed into the second sub-wiring area, where 1≤n≤8, and n is a positive integer.

In an exemplary embodiment of the present disclosure, a width of the first sub-wiring area in the row direction is W1, a width of the second sub-wiring area in the row direction is W2, and a width of the sub-pixel area in the row direction is W3;

wherein 0≤(W1−W2)/(2×W3)≤4%, and W1, W2 and W3 are positive numbers.

In an exemplary embodiment of the present disclosure, the width W1 of the first sub-wiring area is equal to the width W2 of the second sub-wiring area.

In an exemplary embodiment of the present disclosure, the array substrate further includes a first covering portion, wherein an orthographic projection of the first covering portion on the first base completely overlaps with the first wiring area located between two adjacent pixel areas, and the first covering portion is arranged in the same layer as and connected with the common electrode.

In an exemplary embodiment of the present disclosure, one data line is arranged at a side of each column of sub-pixels in the row direction, the data lines and the columns of sub-pixels are alternately arranged in the row direction, each of the data lines is connected with the sub-pixels in the column of sub-pixels adjacent thereto.

In an exemplary embodiment of the present disclosure, one data line is respectively provided on opposite sides of each column of sub-pixels in the row direction column, each of the sub-pixels in the even row in each column of sub-pixels is connected with one data line located at a side thereof and adjacent thereto, and each of the sub-pixels in the odd row is connected with another data line located at the other side thereof and adjacent thereto.

In an exemplary embodiment of the present disclosure, a width of the second scanning line in the row direction is larger than a width of the data line in the row direction.

In an exemplary embodiment of the present disclosure, a ratio of the width of the second scanning line in the row direction to the width of the data line in the row direction is 1.1 to 2.

In an exemplary embodiment of the present disclosure, each of the pixel units comprises three sub-pixels, which are respectively a red sub-pixel, a green sub-pixel and a blue sub-pixel arranged sequentially in the row direction;

wherein the red sub-pixel of one of two groups of pixel units adjacently arranged in the row direction is adjacent to the blue sub-pixel of the other group.

A second aspect of the present disclosure provides a display panel including the array substrate according to any one of the above embodiments and an opposite substrate arranged oppositely with the array substrate.

BRIEF DESCRIPTION OF THE DRAWINGS

The accompanying drawings are used to provide a further understanding of the embodiments of the present disclosure and constitute a part of the specification, and, are used to explain the present disclosure together with the embodiments thereof and do not constitute a limitation to the present disclosure. The above and other features and advantages will become more apparent to those skilled in the art when detailed exemplary embodiments are described with reference to the accompanying drawings, in which.

DETAILED DESCRIPTION

Figure 1:
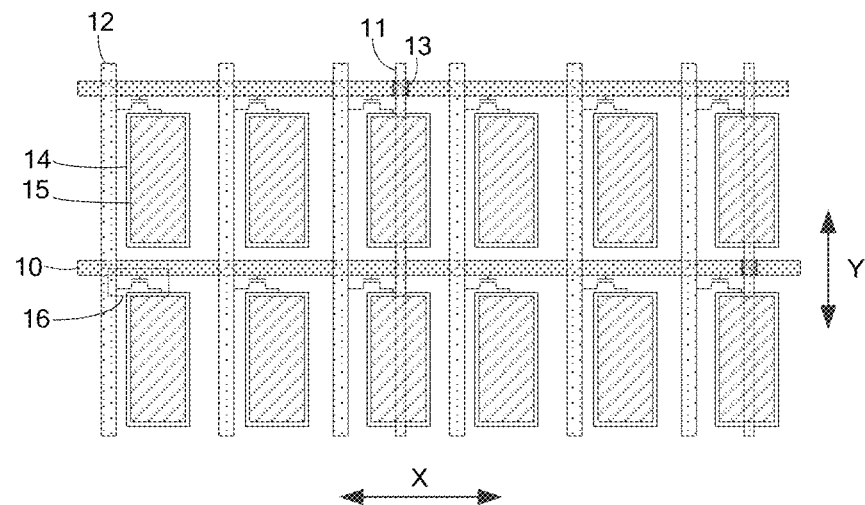
FIG. 1 is a schematic structural view of an array substrate according to an embodiment of the present disclosure.

In order to make the objectives, technical solutions, and advantages of the present disclosure more clear, embodiments of the present disclosure will be described in detail below with reference to the accompanying drawings. It should be noted that the embodiments can be implemented in several different forms. Those ordinary skilled in the art can readily understand that the method and contents can be transformed into various forms without departing from the purpose and scope of the present disclosure. Therefore, the present disclosure should not be interpreted as being limited to the contents described in the following embodiments. The embodiments in the present disclosure and the features in the embodiments can be combined with each other arbitrarily in the case that no conflict occurs.

In the drawings, the size of a component, the thickness of a layer or an area may be exaggerated for the sake of clarity. Therefore, the present disclosure is not necessarily limited to this size, and the shape of size of the component does not reflect a real ratio in the drawings. In addition, the drawings schematically show ideal examples, and an aspect of the present disclosure is not limited to the shape, numerical value, or the like shown in the drawings.

The reference numbers used in the drawings include: 10: horizontal scanning line; 11: vertical scanning line; 12: data line; 13: via hole structure; 14: pixel electrode; 15: common electrode; 16: transistor; 20: first base; 200: sub-pixel area; 201: first sub-wiring area; 202: second sub-wiring area; 203: third wiring area; 204: second wiring area; 21a: red sub-pixel electrode; 21b: blue sub-pixel electrode; 21c: green sub-pixel electrode; 210: first electrode strip; 211: first conductive connecting portion; 22: common electrode; 220: second electrode strip; 221: second conductive connecting portion; 23: first scanning line; 230: hollowed-out hole; 24: second scanning line; 25: data line; 26: first common line; 27: second common line; 28: transistor; 280: gate; 281: active layer; 282: first electrode; 283: second electrode; 29a: gate insulation layer; 29b: passivation layer; 30: metal wire; 31: storage capacitor; 310: first electrode plate; 311: second electrode plate; 32: black matrix; 33: first covering portion; and 34: second covering portion.

In order to realize the full screen design, an embodiment of the present disclosure provides an array substrate which can be applied to a liquid crystal display panel. As shown in FIG. 1, the array substrate may include a plurality of (rows of) horizontal scanning lines 10, a plurality of (columns of) vertical scanning lines 11, a plurality of columns of extending data lines 12, and a plurality of sub-pixels arrayed in a row direction X and a column direction Y. The sub-pixels may include pixel electrodes 14 and common electrodes 15 opposite to each other in a thickness direction of the array substrate (a direction perpendicular to the row direction X and the column direction Y), and transistors 16 connecting the pixel electrodes 14 and the data lines 12. The vertical scanning line 11 is led out from the middle of the sub-pixel, and the vertical scanning line 11 and the horizontal scanning line 10 may be connected through a via hole structure 13. A scanning signal input terminal of the vertical scanning line 11 and a data signal input terminal of the data line 12 may be located on the same side of the array substrate, for example, a binding side of the array substrate. In this way, the other three non-display sides of the array substrate (except the binding side) can be fabricated very narrowly since there is no input terminal of the scanning line and the input terminal of the data line 12. Thus, the screen ratio can be increased, that is, the area of the display area can be increased to achieve a full screen.

Since the vertical scanning line 11 is used to transmit scanning signals, the electric field at the vertical scanning line 11 is extremely strong, which will lead to a light leakage area within 20 μm near the vertical scanning line 11. In order to solve the light leakage problem, it is necessary to cover the light leakage area with a black matrix (BM). Specifically, it is also necessary to consider the influence on the accuracy of opposite arrangement when designing the black matrix, which will greatly reduce the pixel aperture ratio.

Figure 2:
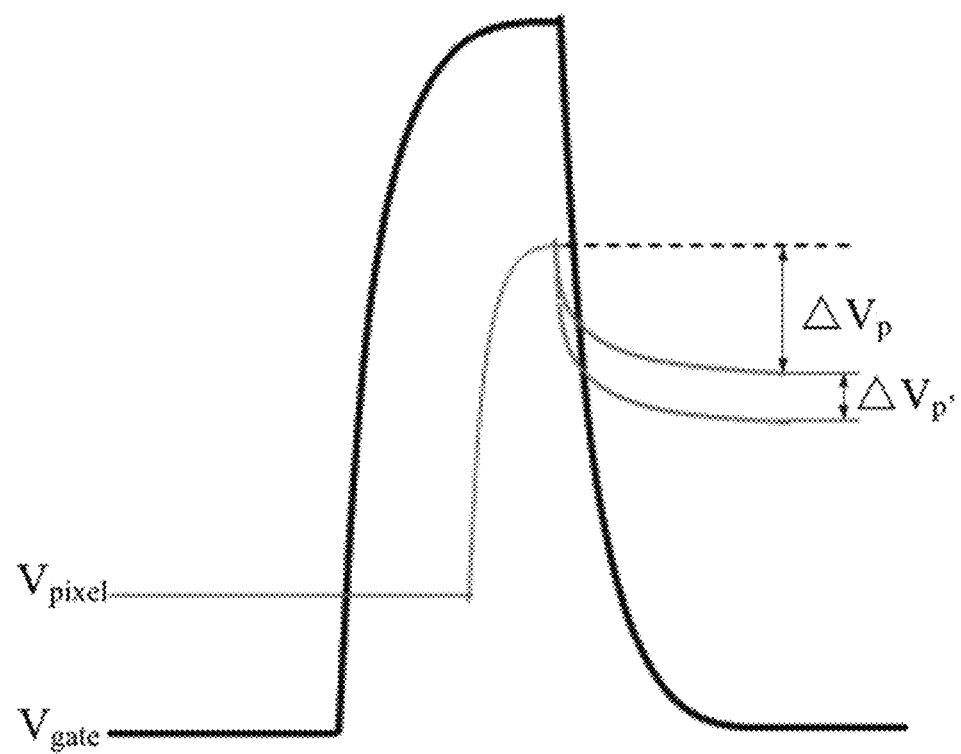
FIG. 2 is a schematic view of coupling waveforms of horizontal scanning lines and vertical scanning lines to pixel electrodes in an array substrate according to an embodiment of the present disclosure.

In addition, the vertical scanning line 11 and the horizontal scanning line 10 need to be switched through the via hole structure 13. At the switching point (i.e., the via hole structure 13), due to the coupling capacitance between the vertical scanning line 11 and the pixel electrode 14, when the vertical scanning line 11 is turned off, the capacitive coupling state of the pixel electrode near the switching point is inconsistent with that of other pixel electrodes (which can be defined as ordinary pixel electrodes). With reference to FIG. 2, the horizontal scanning line 10 pulls the voltage $V_{pixel}$ of the common pixel electrode by $\Delta V_p$, and the pixel electrode at the switching point is pulled by $\Delta V_{p'}$ generated by a voltage Vgate of the vertical scanning line 11 in addition to the $\Delta V_p$ generated by the horizontal scanning line 10. Therefore, the pixel electrode at the switching point will be darker compared with that at other points, and a plurality of switching points are connected into a line, which will be displayed as a dark line Mura, and thus will affect the display.

In addition, as shown in FIG. 1, the common electrode 15 and the pixel electrode 14 are oppositely arranged in the thickness direction of the array substrate. In this design, an overlapping area between the pixel electrode 114 and the common electrode 15 is larger, so that a parasitic capacitance generated between the pixel electrode 114 and the common electrode 15 becomes larger, and thus a charging rate and aperture ratio of the pixel is greatly affected, resulting in poor display effect.

In order to solve the above problems, an embodiment of the present disclosure also provides an array substrate. The array substrate may be used in the liquid crystal display, which is not limited thereto, and may also be used in the organic light-emitting display. The array substrate according to the embodiment of the present disclosure is used in the liquid crystal display as an example.

Figure 3:
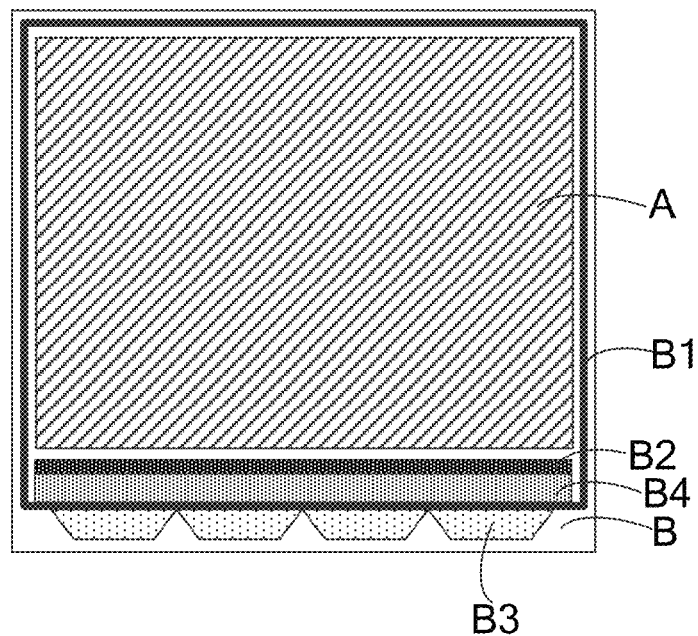
FIG. 3 is a schematic view showing the distribution of various regions in an array substrate according to another embodiment of the present disclosure.

As shown in FIG. 3, the array substrate may be divided into a display area A and a non-display area B surrounding the display area A. The non-display area B of the array substrate 2 may be provided with a sealing area B1 surrounding the display area A, a source electrostatic discharge area B2 located in the sealing area B1 near the display area A, and a fan-out area B3 located in the sealing area B1 away from the display area A. The source electrostatic discharge area B2 and the fan-out area B3 are located in the non-display area B (i.e., the binding area) on the same side of the display area A.

In an embodiment of the present disclosure, the array substrate may include a first base 20, and pixel unit(s), first and second scanning lines 23 and 24, data line(s) 25, and first and second common lines 26 and 27 disposed on the first base 20. It should be noted that the pixel units, the first scanning line 23, the second scanning line 24, the data line 25, the first common line 26, and the second common line 27 are located on the display area A of the array substrate.

As shown in FIGS. 4 to 7, the first base 20 may be in a single layer structure. For example, the first base 20 may be a glass substrate, which is not limited thereto, and it may also be a substrate made of other materials. In addition, the first base 20 may also be in a multilayer structure, depending on the specific situations.

In an embodiment of the present disclosure, as shown in FIGS. 4 to 7, the first base 20 may have a plurality of pixel areas arrayed in the row direction X and the column direction Y, a plurality of (columns of) first wiring areas (in which "column of first wiring area" means that each of the first wiring areas extends in the column direction) arrayed in the row direction X and a plurality of (rows of) second wiring areas 204 (in which "row of second wiring area" means that each of the second wiring areas extends in the row direction) arrayed in the column direction Y. Each of the pixel areas includes at least two sub-pixel areas 200 arranged at intervals in the row direction X; and the first wiring areas and the pixel areas in the columns are alternately arranged in the row direction X, a part of the plurality of the first wiring areas is defined as a first sub-wiring area 201, and the other part is defined as a second sub-wiring area 202. The second wiring areas 204 and the pixel areas in the rows are alternately arranged in the column direction Y. It should be noted that a third wiring area 203 may also be arranged between two adjacent columns of sub-pixel areas 200 in each column of pixel areas. It should be understood that the first sub-wiring area 201, the second sub-wiring area 202 and the third wiring area 203 integrally extend in the column direction Y, while the second wiring area 204 integrally extends in the row direction X. Therefore, it can be seen that there is an overlapping area between the first sub-wiring area 201, the second sub-wiring area 202, and the third wiring area 203 and the second wiring area 204.

Figure 4:
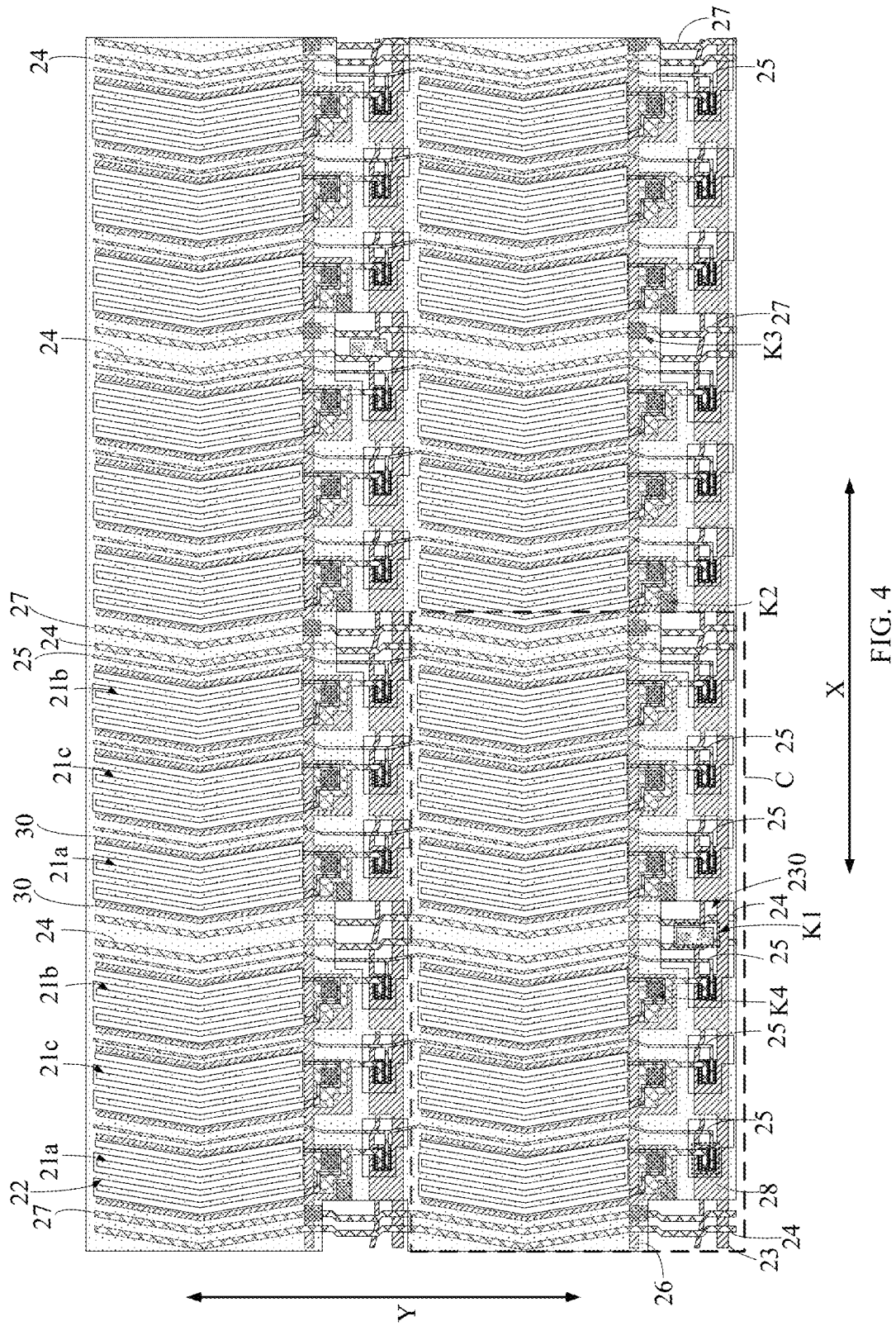
FIG. 4 is a schematic structural view of an array substrate according to another embodiment of the present disclosure.

As shown in FIG. 4, the pixel unit may be provided in plural, and a plurality of pixel units may be arrayed on the first base in the row direction X and the column direction Y. It should be noted that each pixel unit may include at least two sub-pixels arranged in the row direction X, the number of sub-pixels in each pixel unit is equal to the number of sub-pixel areas 200, and the sub-pixels in each pixel unit corresponds to the sub-pixel areas 200 in each pixel area one by one. In addition, the number of columns of pixel units may be equal to the number of columns of the first wiring areas, and the number of rows of pixel units may be equal to the number of rows of the second wiring areas 204.

For example, each pixel unit may include three sub-pixels including a red sub-pixel, a green sub-pixel and a blue sub-pixel respectively arranged in the row direction X. In two adjacent pixel units in the row direction X, the red sub-pixel of one of the two adjacent pixel units is adjacent to the blue sub-pixel of the other of the two adjacent pixel units.

It should be understood that the red sub-pixel mentioned in the embodiment of the present disclosure refers to a sub-pixel corresponding to the red filter unit, that is, this sub-pixel may be used to drive liquid crystal molecules corresponding to the red filter unit to deflect, so that the light emitted by a backlight may be emitted through the red filter unit. Similarly, the blue sub-pixel refers to a sub-pixel corresponding to the blue filter unit, that is, this sub-pixel may be used to drive liquid crystal molecules corresponding to the blue filter unit to deflect, so that the light emitted by the backlight may be emitted through the blue filter unit; and the green sub-pixel refers to a sub-pixel corresponding to the green filter unit, that is, this sub-pixel may be used to drive liquid crystal molecules corresponding to the green filter unit to deflect, so that the light emitted by the backlight may be emitted through the green filter unit.

That is, each pixel unit may include at least two sub-pixels arranged at intervals in the row direction X. Specifically, it may include three sub-pixels corresponding to the red, green and blue filter units, respectively. However, it should be noted that the pixel units in the embodiment of the present disclosure are not limited to the three sub-pixels mentioned above, and may also include more sub-pixels, such as four sub-pixels, etc. The color corresponding to the sub-pixel is not limited to red, green, or blue mentioned above, but may also include other colors, such as white, yellow, etc., depending on the specific situations.

In an embodiment of the present disclosure, each sub-pixel may include sub-pixel electrodes 21a, 21b, 21c, a common electrode 22, and a transistor 28.

Each of the sub-pixel electrodes 21a, 21b and 21c may have a plurality of first electrode strips 210 arranged at intervals in the row direction X, and the first electrode strips 210 may be arranged on the sub-pixel area 200. It should be understood that each of the sub-pixel electrodes 21a, 21b, 21c may also include first conductive connecting portion(s) 211 located on the same side of the first electrode strips 210 and connected with the first electrode strips 210, that is, the sub-pixel electrodes 21a, 21b, 21c may be integrally shaped like a comb, and the first conductive connecting portion 211 may be arranged at the second wiring area 204.

Figure 5:
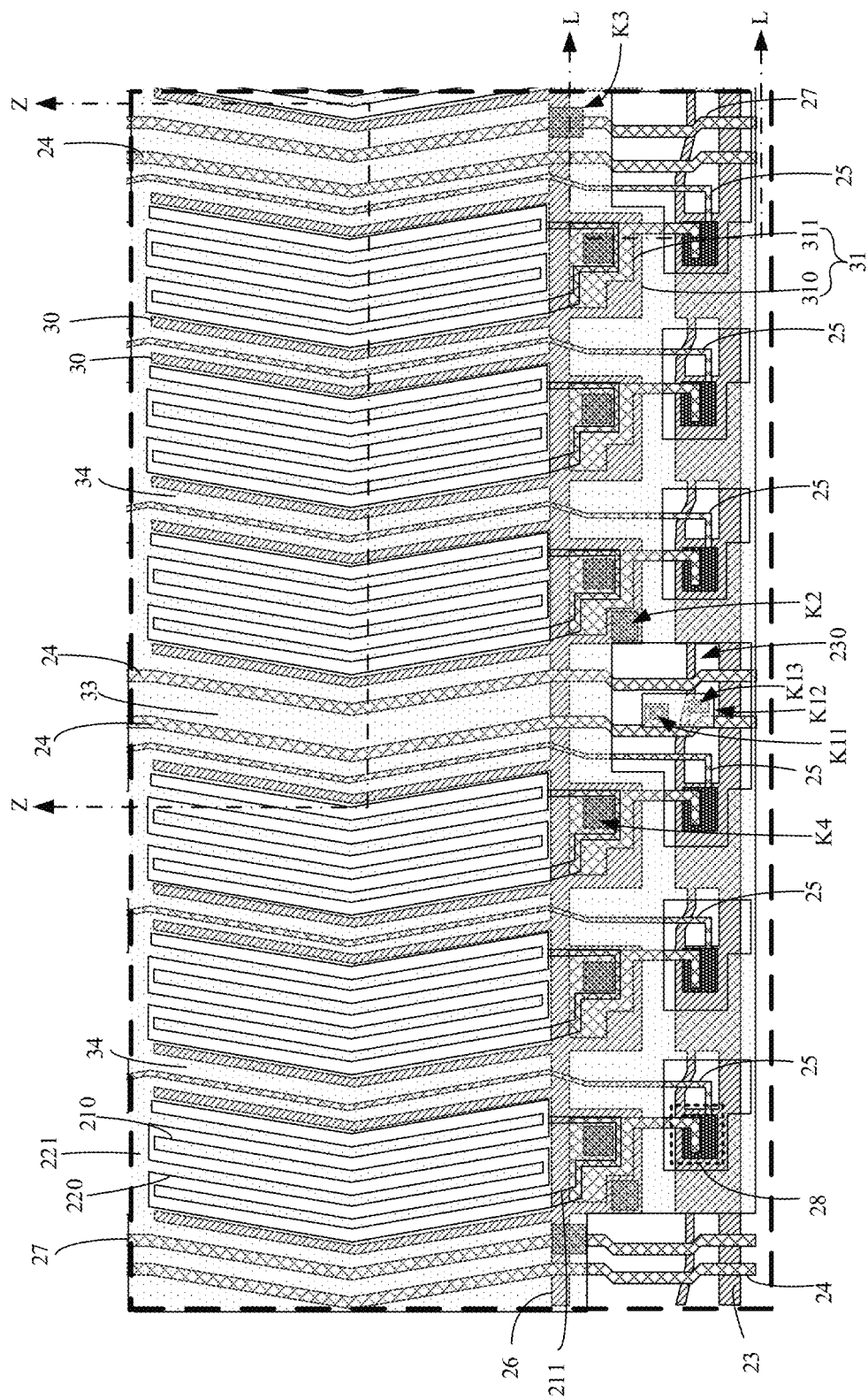
FIG. 5 is an enlarged structural view of a C part of the array substrate shown in FIG. 4.
Figure 6:
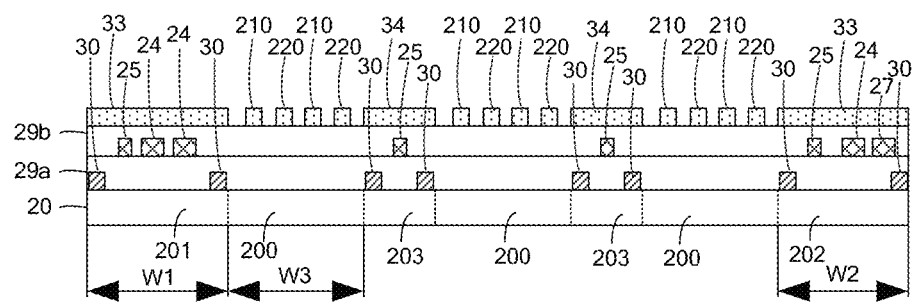
FIG. 6 is a schematic sectional view of the array substrate shown in FIG. 5 along a line Z-Z.
Figure 8:
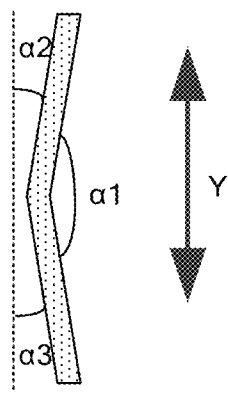
FIG. 8 is a schematic structural view of a first electrode strip in the array substrate shown in FIG. 4.

As shown in FIGS. 4, 5 and 8, the first electrode strip 210 may be in a curved shape as a whole with a bending angle α1 of 150°-170°. Specifically, the first electrode strip 210 may include a two-part structure with an included angle α1 of 150°-160° between two parts. For example, the included angle may be 150°, 156°, 162°, 166°, 170°, etc. In other words, the included angles α2 and α3 between extending directions of these two parts and the column direction Y are 5° to 15°, such as 5°, 7°, 9°, 12°, 15°, etc.

It should be noted that the sub-pixel electrode in the red sub-pixel may be defined as a red sub-pixel electrode 21a, the sub-pixel electrode in the blue sub-pixel may be defined as a blue sub-pixel electrode 21b, and the sub-pixel electrode in the green sub-pixel may be defined as a green sub-pixel electrode 21c. Each of the red sub-pixel electrode 21a, the blue sub-pixel electrode 21b, and the green sub-pixel electrode 21c has a plurality of first electrode strips 210 arranged at intervals in the row direction X. It should be understood that, the red sub-pixel electrode 21a, the blue sub-pixel electrode 21b, and the green sub-pixel electrode 21c have the same structure, for example, number, size, shape, gap, etc. of the first electrode strips 210 are the same. The shape and size of the first conductive connecting portion 211 and the relative position of the first conductive connecting portion with the first electrode strip 210 are the same.

As shown in FIGS. 4 and 5, the common electrode 22 may be arranged in the same layer as the sub-pixel electrodes 21a, 21b and 21c. For example, the aforementioned common electrode 22 and the sub-pixel electrodes 21a, 21b, 21c may be transparent electrodes, and the common electrode 22 and the sub-pixel electrodes 21a, 21b, 21c may be made of ITO (indium tin oxide) material, but are not limited thereto, and may also be made of IZO (indium zinc oxide) and other materials. It should be understood that there is a gap between the common electrode 22 and the sub-pixel electrodes 21a, 21b, 21c (i.e., there is no contact therebetween).

Specifically, the common electrode 22 may have a plurality of second electrode strips 220, the second electrode strips may be located in the sub-pixel area 200. The common electrode 22 may also have a second conductive connecting portion 221 to connect the second electrode strips 220, and the second conductive connecting portion 221 may be located in the second wiring area 204. The second electrode strips 220 of the common electrode 22 and the first electrode strips 210 are alternately arranged in the row direction X, i.e., the sub-pixel electrodes and the common electrode 22 may be inserted into each other. That is, the array substrate according to the embodiment of the present disclosure may be in IPS (In-Plane Switching) mode, so that the parasitic capacitance generated between the sub-pixel electrode and the common electrode can be reduced, thereby improving the pixel charging rate and aperture ratio. However, it is not limited to the above embodiments, the common electrode 22 and the sub-pixel electrode may also be located at different layers of the array substrate and arranged oppositely, and one of the common electrode 22 and the sub-pixel electrode may be a slit electrode with a slit, and the other is a plate electrode without a slit, that is, the array substrate of the embodiment of the present disclosure may also be in FFS (Fringe Field Switching) mode, depending on the specific situations.

It should be noted that the common electrodes 22 of the sub-pixels may be connected with each other to form a whole structure.

Figure 9:
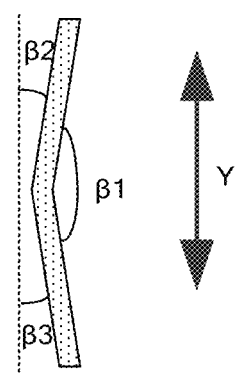
FIG. 9 is a schematic structural view of a second electrode strip in the array substrate shown in FIG. 4.

In an embodiment of the present disclosure, as shown in FIGS. 4, 5 and 9, the second electrode strip 220 may be in a curved shape with a bending angle β1 of 150°-170°. Specifically, the second electrode strip 220 may include a two-part structure with an included angle β1 of 150°-160° between two parts. For example, the included angle β1 may be 150°, 156°, 162°, 166°, 170°, etc. In other words, the included angles β2 and β3 between extending directions of these two parts and the column direction Y are 5° to 15°, such as 5°, 7°, 9°, 12°, 15°, etc.

The second electrode strip 220 and the first electrode strip 210 may be substantially parallel to each other, that is, the bending angle β1 of the second electrode strip 220 may be the same as the bending angle α1 of the first electrode strip 210.

Based on the above, each of the first electrode strip 210 of the sub-pixel electrode and the second electrode strip 220 of the common electrode 22 is arranged in a curved shape with a bending angle designed to be 150°-170°, which can reduce the color cast and improve the display effect.

It should be noted that the first electrode strips 210 and the second electrode strips 220 in each sub-pixel are not limited to the aforementioned alternating arrangement in the row direction X, but may also be alternately arranged in the column direction Y, depending on actual requirements.

In addition, it should be noted that when the first electrode strip 210 and the second electrode strip 220 are in the curved shape as mentioned above, the overall shape of the sub-pixel area 200 may be the same as that of the first electrode strip 210, and the overall shape of the first sub-wiring area 201, the second sub-wiring area 202 and the third wiring area 203 may also be the same as that of the first electrode strip 210, so that the sub-pixel electrodes in the array substrate can be arranged more densely. The overall shape of the second wiring area 204 may be adapted to the shape of the signal lines (e.g., the first scanning line 23 and the first common line 26) on the second wiring area 204.

Figure 7:
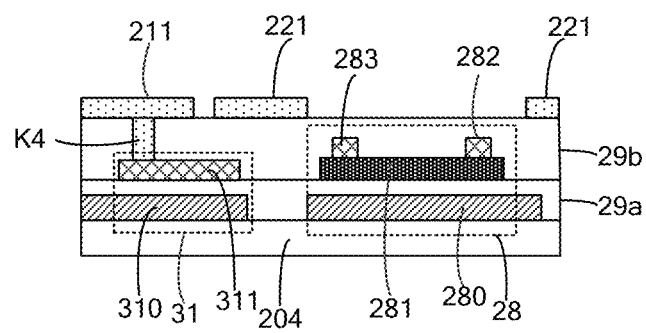
FIG. 7 is a schematic sectional view of the array substrate shown in FIG. 5 along a line L-L.

According to FIGS. 4, 5 and 7, the transistor 28 of each sub-pixel may be located in the second wiring area 204. It should be understood that the transistor 28 as a whole may be located at a side of the sub-pixel electrodes 21a, 21b and 21c and the common electrode 22 close to the first base 20, that is, the transistor 28 may be fabricated on the first base 20 before the sub-pixel electrodes and the common electrode 22. As shown in FIGS. 4 and 5, each transistor 28 may be connected to one sub-pixel electrode, which is not limited thereto, and one transistor 28 may be connected to a plurality of sub-pixel electrodes, or one sub-pixel electrode may be connected to a plurality of transistors 28, etc., depending on the specific situations.

Specifically, as shown in FIGS. 4, 5 and 7, the transistor 28 includes a gate 280, an active layer 281, and a first electrode 282 and a second electrode 283 arranged on the same layer. The first electrode 282 is connected to one end of the active layer 281, the second electrode 283 is connected to the other end of the active layer 281, and the second electrode 283 may be connected with the sub-pixel electrode through a fourth via hole structure K4, and specifically may be connected with the first conductive connecting portion 211 of the sub-pixel electrode through the fourth via hole structure K4. It should be understood that one of the first electrode 282 and the second electrode 283 may be a source and the other may be a drain; and the fourth via hole structure K4 may be located in the second wiring area 204.

In an embodiment of the present disclosure, the gate 280, the first electrode 282 and the second electrode 283 mentioned above may be made of metal materials, for example, aluminum, molybdenum and other metal materials. The gate 280, the first electrode 282 and the second electrode 283 may be in a composite layer structure or a single layer structure, depending on the specific situations.

As shown in FIG. 7, the transistor 28 of the embodiment of the present disclosure may be of bottom gate type, that is, the active layer 281 is located at a side of the gate 280 away from the first base 20. It should be understood that a gate insulating layer 29a may be formed between the active layer 281 and the gate 280. That is, in the process of manufacturing the array substrate, the gate 280 may be formed on the first base 20 firstly; and then, a gate insulating layer 29a covering the gate 280 is formed. After that, an active layer 281 directly opposite to the gate 280 is formed on the gate insulating layer 29a. It should be noted that the entire layer of the gate insulating layer 29a is disposed on the first base 20, that is, the gate insulating layer 29a not only covers the gate 280, but also covers other structures fabricated before the gate insulating layer 29a. It should be understood that the gate insulating layer 29a may be made of inorganic materials, such as silicon oxide, silicon oxynitride and other materials.

The aforementioned transistor 28 may be fabricated on the first base 20 before the sub-pixel electrode, that is, in the process of fabricating the array substrate, the transistor 28 may be formed on the first base 20 first; and a sub-pixel electrode and a common electrode 22 are then formed. It should be noted that after the first electrode 282 and the second electrode 283 of the transistor 28 are formed on the first base 20, and before the sub-pixel electrode and the common electrode 22 are formed, a passivation layer 29b may also be formed. As shown in FIG. 7, the passivation layer 29b covers the first electrode 282 and the second electrode 283, and the first conductive connecting portion 211 of the sub-pixel electrode may be connected to the second electrode 283 via the fourth via hole structure K4 penetrating through the passivation layer 29b.

The entire layer of the passivation layer 29b is disposed on the areas of the first base 20, that is, the passivation layer 29b not only covers the first electrode 282 and the second electrode 283, but also covers other structures fabricated on the first base 20 before the passivation layer 29b. It should be understood that the passivation layer 29b may be made of inorganic materials, such as silicon oxide and silicon oxynitride.

An organic insulating layer (not shown) may also be formed between the passivation layer 29b and the sub-pixel electrode. That is, in the process of manufacturing the array substrate, the passivation layer 29b may be formed on the first base 20 firstly; and the organic insulating layer is then formed on the passivation layer 29b. After that, a sub-pixel electrode is formed on the organic insulating layer. The first conductive connecting portion 211 of the sub-pixel electrode may be connected to the second electrode 283 via the fourth via hole structure K4 penetrating through the organic insulating layer and the passivation layer 29b.

In an embodiment of the present disclosure, the planarization is realized by providing the organic insulating layer, which is beneficial to the subsequent coating of the sub-pixel electrode material, and at the same time, may increase the distance between the sub-pixel electrode and the layer where the second electrode 283 is located, so that the signal line on the layer where the second electrode 283 is located can be prevented from interfering with the sub-pixel electrode.

It should be noted that the array substrate of the embodiment of the present disclosure may not be provided with an organic insulating layer.

A color filter layer (not shown) may also be formed between the passivation layer 29b and the organic insulating layer. That is, in the process of manufacturing the array substrate, the passivation layer 29b may be formed on the first base 20 firstly; and the color filter layer is then formed on the passivation layer 29b. After that, the organic insulating layer is formed on the color filter layer. The first conductive connecting portion 211 of the sub-pixel electrode may be connected to the second electrode 283 through the fourth via hole structure K4 penetrating through the organic insulating layer, the color filter layer and the passivation layer 29b. For example, the color filter layer may include the aforementioned red, green, blue and other filter units.

It should be noted that the array substrate of the embodiment of the present disclosure may not be provided with a color filter layer, and the color filter layer may be provided in an opposite substrate.

In addition, the transistor 28 of the embodiment of the present disclosure is not limited to the bottom gate type, and it may also be of a top gate type, depending on the specific situations.

As shown in FIG. 4, the first scanning line 23 may be arranged in plural, and a plurality of (rows of) the first scanning lines 23 are sequentially arranged on the first base 20 in the column direction Y. The first scanning line 23 may be located in the second wiring area 204. The first scanning line 23 may be formed between the first base 20 and the common electrode 22, that is, in the process of manufacturing the array substrate, the first scanning line 23 may be formed on the first base 20 firstly, and the common electrode 22 and the sub-pixel electrode are then formed. For example, the first scanning line 23 may be arranged in the same layer as and connected to the gate 280 of the transistor 28. It should be understood that the gate 280 of the transistor 28 and the first scanning line 23 may have an integrated structure.

In an embodiment of the present disclosure, each (row of) second wiring area 204 may be provided with at least one first scanning line 23 (in which each of the at least one first scanning line extend in the row direction). In other words, at least one first scanning line 23 may be disposed at a side of each row of pixel units in the column direction Y. For example, each of the second wiring areas 204 may be provided with one first scanning line 23, wherein the same (row of) first scanning line 23 is connected with gates of transistors of sub-pixels in the same row, that is, one first scanning line 23 may provide scanning signals for sub-pixels in one row of pixel units; however, it is not limited thereto, and two (rows of) first scanning lines 23 may also be arranged in every second wiring area 204, depending on the specific situations.

As shown in FIG. 4, the first common line 26 may be arranged in plural, and a plurality of (rows of) the first common lines are sequentially arranged on the first base in the column direction Y. The first common line 26 is connected to the sub-pixel for providing a common signal for the sub-pixel. The first common line 26 may be formed between the first base 20 and the common electrode 22. That is, in the process of manufacturing the array substrate, the first common line 26 may be formed on the first base 20 firstly, and the common electrode 22 and the sub-pixel electrode may be then formed. For example, the first common line 26 may be arranged in the same layer as the first scanning line 23, and the first common line 26 may be connected with the common electrode 22 through a second via hole structure K2 to provide a common signal for the common electrode 22. Specifically, the first common line 26 may be connected with the second conductive connecting portion 221 of the common electrode 22 through the second via hole structure K2. It should be noted that, the second via hole structure K2 may be located in the second wiring area 204.

In an embodiment of the present disclosure, each second wiring area 204 may be provided with at least one first common line 26 (in which each of the at least one first common line extends in the row direction) thereon. In other words, at least one first common line 26 may be disposed at a side of each row of pixel units in the column direction Y. For example, each of the second wiring areas 204 may be provided with one first common line 26. One (row of) first common line 26 is connected with the common electrodes of the same color sub-pixels in the same row through the second via hole structures K2. For example, the first common lines 26 in one row are connected with the second conductive connecting portions 221 of the common electrodes 22 of the red sub-pixels in the same row through the second via hole structure K2.

When the first common line 26 is connected to the common electrode 22 through the second via hole structure K2, the second via hole structure K2 as mentioned may at least penetrate through the aforementioned gate insulating layer 29a and passivation layer 29b. Optionally, when the array substrate includes the aforementioned organic insulating layer and color filter layer, the second via hole structure K2 as mentioned may also penetrate through the organic insulating layer and the color filter layer.

Based on the above, each (row of) second wiring area 204 may be provided with one (row of) first scanning line 23 and one (row of) first common line 26 thereon. It should be understood that there is no connection between the first common line 26 and the first scanning line 23.

As shown in FIG. 4, the second common line 27 may be arranged in plural, and a plurality of (columns of) second common lines 28 are sequentially arranged on the first base 20 in the row direction X. The second common line 27 may be formed between the first base 20 and the common electrode 22. That is, in the process of manufacturing the array substrate, the second common line 27 may be formed on the first base 20 firstly, and the common electrode 22 and the sub-pixel electrode are then formed. The passivation layer 29b as mentioned above is formed between the second common line 27 and the common electrode 22 and the sub-pixel electrode.

For example, the second common line 27 may be arranged in the same layer as the first electrode 282 and the second electrode 283 of the transistor 28, wherein the aforementioned first common line 26 may be arranged in the same layer as the first scanning line 23, and the first scanning line 23 may be arranged in the same layer as the gate 280 of the transistor 28. Therefore, it can be seen that the second common line 27 in this embodiment of the present disclosure is fabricated after the first common line 26 being fabricated. It should be noted that the aforementioned gate insulating layer 29a is formed between the second common line 27 and the first common line 26.

In an embodiment of the present disclosure, the second common line 27 may be connected with the common electrode 22 through a third via hole structure K3. Specifically, as shown in FIG. 4, when the second common line 27 is connected with the common electrode 22 through the third via hole structure K3, the third via hole structure K3 may at least penetrate through the passivation layer 29b as mentioned above. Further, when the array substrate includes the organic insulation layer and the color filter layer as mentioned above, the third via hole structure K3 may also penetrate through the organic insulation layer and the color filter layer. It should be noted that the third via hole structure K3 may be located in the second wiring area 204, and the second common line 27 may be connected with the second conductive connecting portion 221 of the common electrode 22 through the third via structure K3.

At least one of the first common line 26 and the second common line 27 has a common signal input terminal to provide a common signal for the common electrode 22. Optionally, the second common line 27 has a common signal input terminal, and the second common line 27 may transmit a received common signal to the first common line 26 and the common electrode 22, but is not limited thereto, or alternatively, both the first common line 26 and the second common line 27 may have a common signal input terminal.

In an embodiment of the present disclosure, each (column of) second sub-wiring area 202 may be provided with one second common line 27 (in which the second common line 27 extends in the column direction). For example, a shape of a part of the second common line 27 opposite to the first electrode strip 210 in the row direction X may match with a shape of the first electrode strip 210, that is, when the first electrode strip 210 is in a curved shape, the part of the second common line 27 opposite to the first electrode strip 210 in the row direction X may also be in a curved shape and substantially parallel with the first electrode strip 210.

It should be understood that only the first common line 26 or only the second common line 27 may be provided in the embodiment of the present disclosure, depending on the specific situations.

As shown in FIG. 4, the second scanning line 24 may be arranged in plural, and a plurality of (columns of) second scanning lines are sequentially arranged on the first base 20 in the row direction X. For example, the second scanning line 24 may be formed between the first base 20 and the common electrode 22. That is, in the process of manufacturing the array substrate, the second scanning line 24 may be formed on the first base 20 firstly, and then the common electrode 22 and the sub-pixel electrode are formed. For example, the second scanning line 24 may be arranged in the same layer as the first electrode 282 and the second electrode 283 of the transistor 28. It should be understood that there is a gap between the second scanning line 24 and the first electrode 282 as well as the second electrode 283 of the transistor 28 (i.e., there is no contact therebetween).

As shown in FIG. 4, each first wiring area is provided with at least one second scanning line 24 (in which each of the at least one second scanning line extends in the column direction). In other words, at least one second scanning line 24 is arranged at a side of each row of pixel units in the row direction X. It should be noted that the red sub-pixel in one of two adjacent pixel units in the row direction X is adjacent to the blue sub-pixel in the other thereof. Therefore, it can be seen that the second scanning line 24 in the embodiment of the present disclosure may be located between the red sub-pixel and the blue sub-pixel in two adjacent columns.

For example, the shape of a part of the second scanning line 24 opposite to the first electrode strip 210 in the row direction X may match with the shape of the first electrode strip 210, that is, when the first electrode strip 210 is in a curved shape, the part of the second scanning line 24 opposite to the first electrode strip 210 in the row direction X may also be in a curved shape and parallel to the first electrode strip 210.

In an embodiment of the present disclosure, the second scanning line 24 is connected with a (row of) first scanning line 23 through the first via hole structure K1. The second scanning line 24 has a scanning signal input terminal. The scanning signal received by the second scanning line 24 may be transmitted to the gate 280 of the corresponding transistor 28 through the first via hole structure K1 and the first scanning line 23 so as to control turning-on and turning-off of the transistor 28.

Optionally, the first via hole structure K1 may include a first via hole portion K11 and a connecting portion K12, wherein the connecting portion K12 and the second scanning line 24 are located in different layers of the array substrate, and a part of the connecting portion K12 is connected with the first scanning line 23 and a part of the connecting portion K12 is connected with the second scanning line 24 through the first via hole portion K11.

Further, the connecting portion K12 is arranged in the same layer as the common electrode 22 and the sub-pixel electrode, and there is a gap between the connecting portion K12 and the common electrode 22 as well as the sub-pixel electrode (i.e., there is no contact therebetween). In this case, the first via hole structure K1 may further include a second via hole portion K13, and the connecting portion K12 may be connected with the first scanning line 23 through the second via hole portion K13. That is, a part of the connecting portion K12 may be connected with the first scanning line 23 through the second via hole portion K13, and a part of the connecting portion K12 is connected with the second scanning line 24 through the first via hole portion K11.

It should be noted that when the connecting portion K12 is arranged in the same layer as the common electrode 22 and the sub-pixel electrode, the first via hole portion K11 may at least penetrate through the passivation layer 29b. Further, when the array substrate includes the aforementioned organic insulation layer and color filter layer, the first via hole portion K11 may also penetrate through the organic insulation layer and the color filter layer. The second via hole portion K13 may at least penetrate through the gate insulating layer 29a and the passivation layer 29b. Further, when the array substrate includes the aforementioned organic insulating layer and color filter layer, the second via hole portion K13 may also penetrate through the organic insulating layer and the color filter layer.

In an embodiment of the present disclosure, the first scanning line 23 may be provided with a plurality of hollowed-out holes 230. An orthographic projection of the second via hole portion K13 on the first base 20 partly overlaps with an orthographic projection of the first scanning line 23 on the first base 20, and the orthographic projection of the second via hole portion K13 on the first base 20 partly overlaps with an orthographic projection of the hollowed-out holes 230 on the first base 20. In this way, the parasitic capacitance generated between the connecting portion K12 and the first scanning line 23 may be reduced.

It should be noted that the aforementioned first via hole structure K1 may be located in the second wiring area 204. The first common line 26 may be designed to avoid the first via hole structure K1, that is, an orthographic projection of the aforementioned first via hole structure K1 on the first base 20 does not overlap with an orthographic projection of the first common line 26 on the first base 20.

It should be understood that the connecting portion K12 is not limited to being arranged in the same layer as the common electrode 22. For example, the connecting portion K12 may be arranged in the same layer as the first scanning line 23 and directly connected with the first scanning line 23, that is, it is not necessary to provide the aforementioned second via hole portion K13. When the connecting portion K12 may be arranged in the same layer as the first scanning line 23, the connecting portion K12 may entirely extend in the column direction, and may be located on the first wiring area between two adjacent pixel units in the row direction X.

Optionally, each (row of) first scanning line 23 may be connected with two (columns of) second scanning lines 24. In other words, the two second scanning lines 24 are respectively connected with the same first scanning line 23 through a first via hole structure K1, that is, each row (of first scanning line) may be driven by two sets of scanning signals, enhancing the scanning signals and improving the display effect. However, it is not limited thereto, and each first scanning line 23 may also be connected with one second scanning line 24 or with three or more second scanning lines. It should be noted that, in order to ensure the display uniformity, the numbers of second scanning lines 24 connected to each of the first scanning lines 23 need to be consistent.

Based on the above, it can be seen that, compared with the solution in which the vertical scanning line 11 is led out from the middle of the sub-pixel as shown in FIG. 1, the second scanning line 24 according to an embodiment of the present disclosure is arranged in the first wiring area, so that an overlapping area between the second scanning line 24 and the sub-pixel electrode may be reduced, and thus the coupling capacitance between the second scanning line 24 and the sub-pixel electrode may be reduced, so as to improve $\Delta Vp$ generated by the scanning signal pulling the pixel electrode at the second scanning line 24, thereby overcoming the Mura phenomenon and improving the product quality. It should be noted that the coupling capacitance generated between the second scanning line 24 and the sub-pixel electrode in the embodiment of the present disclosure is small and may be negligible.

In addition, since the number proportion of cone cells responsible for color (green, red, blue) perception is 40:20:1, the human eyes are most sensitive to green at present. That is, in the practical applications, red and blue have less influence on the transmittance of the liquid crystal display panel than green. Based on this, the present disclosure further designs the second scanning line 24 between adjacent red and blue sub-pixels. Even if the second scanning line 24 causes light leakage at the red and blue sub-pixels, it is difficult to be detected by human eyes and has relatively small impact. Therefore, the width of the black matrix can be reduced, or the black matrix can be omitted to improve the pixel aperture ratio.

In an embodiment of the present disclosure, since the scanning signal provided by the second scanning line 24 is strong, the second scanning line 24 is arranged on each of the first sub-wiring areas 201 as shown in FIG. 4, so as to ensure the display uniformity. That is, the second scanning line 24 is arranged on both the first sub-wiring area 201 and the second sub-wiring area 202. Specifically, one of the first sub-wiring area 201 and the second sub-wiring area 202 is provided with at least one second scanning line 24, while the other is provided with one second scanning line 24.

Optionally, two second scanning lines 24 are arranged on each of the first sub-wiring areas 201, and one second scanning line 24 is arranged on each of the second sub-wiring areas 202. The two second scanning lines 24 on the same first sub-wiring area 201 are respectively connected with different first scanning lines 23 through the first via hole structure K1, thus ensuring the display effect and reducing the processing difficulty.

It should be noted that, in order to further ensure the display uniformity, the number of signal lines on the first sub-wiring area 201 may be equal to the number of signal lines on the second sub-wiring area 202. The aforementioned first sub-wiring area 201 is provided with two second scanning lines 24, while the second sub-wiring area 202 is provided with one second scanning line 24. In order to make the number of signal lines on the second sub-wiring area 202 consistent with the number of signal lines on the first sub-wiring area 201, each second sub-wiring area 202 may be provided with one second common line 27 as mentioned above.

Taking a 4K resolution display panel as an example, there are 3840 columns and 2160 rows of pixel units in the 4K resolution display panel, wherein each pixel unit includes a red sub-pixel, a green sub-pixel and a blue sub-pixel arranged sequentially in the row direction. Therefore, there are 3840×3 columns and 2160 rows of sub-pixels in the 4K resolution display panel, that is, there are 3840 (columns of) first wiring areas and there are 2160 (rows of) second wiring areas 204. Each (row of) the second wiring area 204 is provided with one (row of) first scanning line 23, that is, there are 2160 (rows of) first scanning lines. The two second scanning lines 24 are connected with one first scanning line 23, that is, there are 2160×2 (columns of) second scanning lines 24. The number of (columns of) the first wiring areas and the number of (columns of) the second scanning lines 24 is 8:9. In other words, every 8 first wiring areas forms a group, and a total of 9 second scanning lines 24 are provided. That is, in each group of first wiring areas, one first wiring area forms a first sub-wiring area 201 having two second scanning lines 24; while the remaining 7 first wiring areas form second sub-wiring areas 202, and each of the second sub-wiring areas 202 has one second scanning line 24 and one second common line 27.

In other words, in an embodiment of the present disclosure, a plurality of first wiring areas are divided into a plurality of (columns of) first wiring area groups, and each first wiring area group includes 8 first wiring areas arranged sequentially in the row direction X. That is, in each of the first wiring area groups, a $1^{st}$ first wiring area, a $2^{nd}$ first wiring area, . . . , a $8^{th}$ first wiring area are arranged sequentially in the row direction X. It should be noted that, the first wiring areas in each of the first wiring area groups have the same arrangement direction. In each of the first wiring area groups, the $n^{th}$ first wiring area is formed into the first sub-wiring area 201, and the remaining 7 first wiring areas are formed into the second sub-wiring areas 202, where $1 \leq n \leq 8$ and n is a positive integer. That is, the first wiring area 201 in each of the first wiring area groups is located in the same column.

It should be noted that the display panel of the embodiment of the present disclosure is not limited to the aforementioned 4K resolution, and other resolutions are also possible. Therefore, the total number of the first wiring areas, the proportion and positional relationship of the first sub-wiring areas 201 and the second sub-wiring areas 202 are not limited to those mentioned above, and may also be determined according to specific situations as long as the display uniformity of the entire panel can be ensured.

In addition, it should be noted that some of the second sub-wiring areas 202 in a plurality (columns of) the second sub-wiring areas 202 may not be provided with the second common line 27, and the second sub-wiring area 202 without the second common line 27 may be uniformly arranged in the display panel, depending on actual requirements.

As shown in FIGS. 4 and 5, the data line 25 may be arranged in plural, and a plurality of date lines are sequentially arranged on the first base 20 in the row direction X, and are connected with sub-pixels for providing data signals for the sub-pixels. For example, the data line 25 is formed between the first base 20 and the common electrode 22. In other words, in the process of manufacturing the array substrate, the data line 25 may be formed on the first base 20 firstly, and then the common electrode 22 and the sub-pixel electrode are formed. The data line 25 has a data signal input terminal and is connected with the first electrode 282 of the transistor 28, that is, the data line 25 may transmit a received data signal to the first electrode 282 of the transistor 28. Optionally, the data line 25 may be arranged in the same layer as the first electrode 282 of the transistor 28.

In an embodiment of the present disclosure, the first sub-wiring area 201, the second sub-wiring area 202, and the third wiring area 203 may each be provided with at least one data line 25. In other words, the data line 25 is provided on at least one side of each column of sub-pixels in the row direction X.

In an optional embodiment, as shown in FIG. 4, one (column of) data line 25 is arranged at a side of each column of sub-pixels in the row direction X, and the (columns of) data lines 25 and the columns of sub-pixels are alternately arranged in the row direction X. In other words, one data line 25 may be arranged on the first sub-wiring area 201, the second sub-wiring area 202 and the third wiring area 203, wherein each data line 25 is connected with the sub-pixels in one column that are adjacent to the data line.

Figure 10:
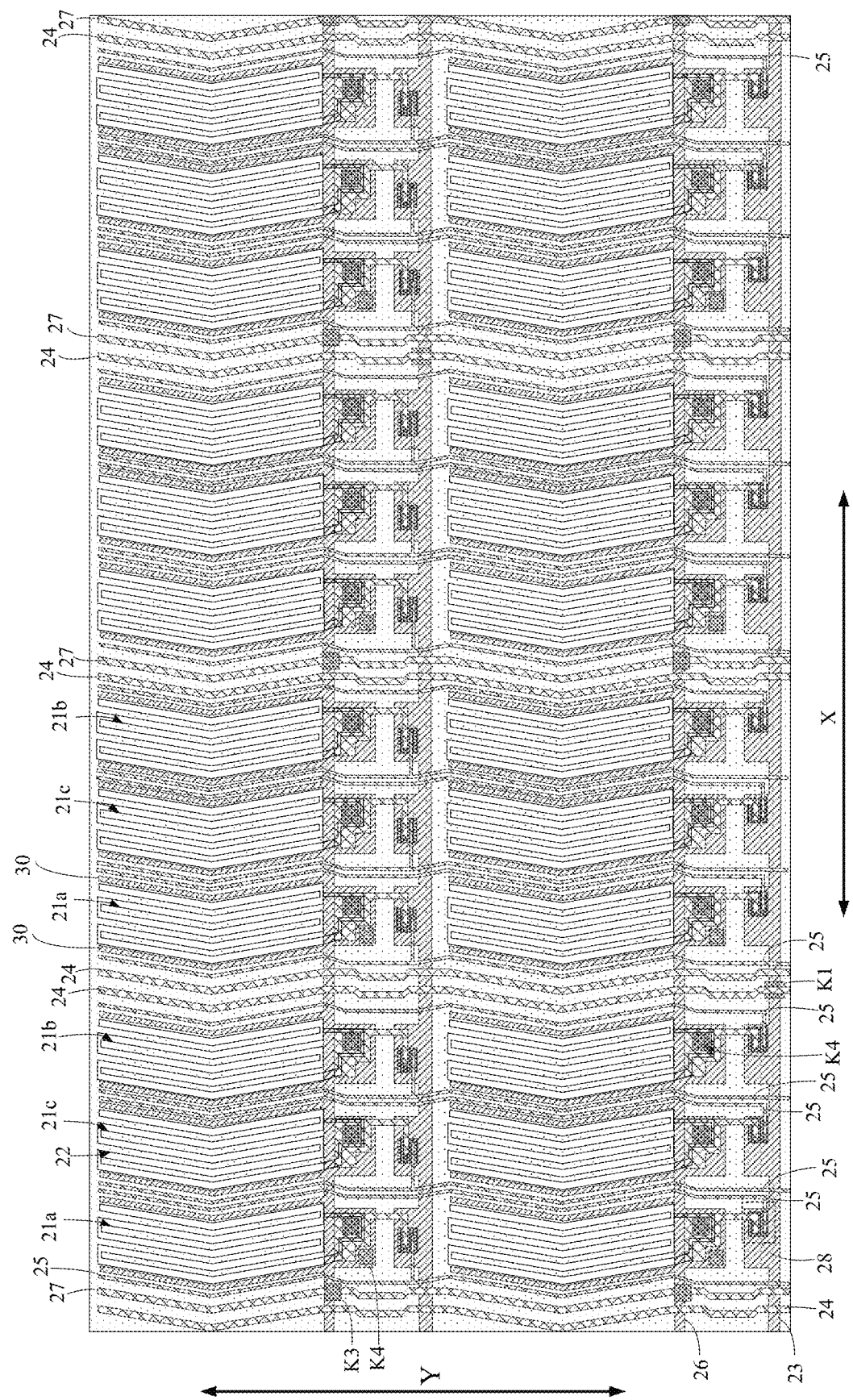
FIG. 10 is a schematic structural view of an array substrate according to yet another embodiment of the present disclosure.

In another optional embodiment, as shown in FIG. 10, one data line 25 is arranged on each of opposite sides of each column of sub-pixels in the row direction X, that is, two data lines 25 are arranged on the first sub-wiring area 201, the second sub-wiring area 202 and the third wiring area 203 between two adjacent columns of sub-pixels. The sub-pixels in the even row in each column of sub-pixels is connected with one data line 25 located at a side thereof and adjacent thereto, and the sub-pixels in the odd row is connected with another data line 25 located at the other side thereof and adjacent thereto, that is, each column of sub-pixels are matched and connected with two data lines 25, and these two data lines 25 are located on opposite sides of each column of sub-pixels in the row direction X, respectively, thereby improving the charging time.

It should be understood that the distance between each of two data lines 25 on both sides of the sub-pixel and the sub-pixel may be equal, so that both sides of the sub-pixel are pulled by the data signal uniformly, there is substantially no pressure difference generated by the data signal on both sides of the sub-pixel when the brightness is L0, and then it is unnecessary to consider light leakage at the first sub-wiring area 201, the second sub-wiring area 202 and the third wiring area 203.

It should be noted that no matter whether one data line 25 or two data lines 25 are provided in the first sub-wiring area 201 and the second sub-wiring area 202, the data line 25 is closer to a column of sub-pixels connected thereto than the second common line 27 and the second scanning line 24.

In an embodiment of the present disclosure, a shape of a part of the data line 25 opposite to the second electrode strip 220 in the row direction X may match with a shape of the second electrode strip 220, that is, when the second electrode strip 220 is in a curved shape, the part of the data line 25 opposite to the second electrode strip 220 in the row direction may also be in a curved shape and may be substantially parallel to the second electrode strip 220.

In an embodiment of the present disclosure, a width of the second scanning line 24 in the row direction X may be larger than a width of the data line 25 in the row direction X. Optionally, a ratio of the width of the second scanning line 24 in the row direction X to the width of the data line 25 in the row direction X may be 1.1 to 2, such as 1.1, 1.3, 1.5, 1.7, 2, etc. For example, the width of the data line 25 in the row direction X may be about 6 μm, and the width of the second scanning line 24 in the row direction X may be about 10 μm; however, it is not limited thereto. The width may also be other values depending on the specific situations.

Optionally, the width of the second common line 27 in the row direction X may be equal to the width of the second scanning line 24.

In an embodiment of the present disclosure, the width of the first sub-wiring area 201 in the row direction X may be W1, the width of the second sub-wiring area 202 in the row direction X may be W2, and the width of the sub-pixel area 200 in the row direction X may be W3, where $0 \leq (W1-W2)/(2 \times W3) \leq -4\%$, and W1, W2 and W3 are positive numbers. This design can avoid the risk of vertical Mura at the second scanning line 24.

Optionally, the width W1 of the first sub-wiring area 201 may be equal to the width W2 of the second sub-wiring area 202, so as to reduce the design difficulty.

In an embodiment of the present disclosure, the array substrate may further include a first covering portion 33. An orthographic projection of the first covering portion 33 on the first base 20 completely overlaps with the first wiring area located between two adjacent pixel areas, and the first covering portion 33 is arranged and connected with the common electrode 22 of the sub-pixels, that is, the first covering portion 33 may cover signal lines (e.g., the second scanning line 24, the data line 25 and the second common line 27) between adjacent pixel areas, so as to shield signals, thereby alleviating and eliminating the influence of the signals on the electric field at the sub-pixel area 200 here, improving or eliminating the problem of the light leakage between adjacent pixel areas, reducing the area of the black matrix BM or eliminating the need to design a black matrix, and improving the pixel aperture ratio.

It should be noted that the orthographic projection of the first covering portion 33 on the first base 20 does not overlap with the second wiring area 204. Opposite sides of the first covering portion 33 in the column direction Y are respectively connected with the second conductive connecting portions 221 of the common electrodes 22 of adjacent two rows of sub-pixels.

In addition, the array substrate may further include a second covering portion 34. An orthographic projection of the second covering portion 34 on the first base 20 completely overlaps with the third wiring area 203 located between two adjacent sub-pixel areas 200 in each pixel area, and the second covering portion 34 is arranged in the same layer and connected with the common electrode 22 of the sub-pixels, that is, the second covering portion 34 may cover signal lines (e.g., the data line 25) between two adjacent sub-pixel areas 200 in each pixel area, so as to shield signals, thereby alleviating and eliminating the influence of the signals on the electric field at the sub-pixel area 200, improving or eliminating the problem of the light leakage between two adjacent sub-pixel areas 200 in each pixel area, reducing the area of the black matrix BM here or eliminating the need to design a black matrix, and improving the pixel aperture ratio.

It should be noted that the orthographic projection of the second covering portion 34 on the first base 20 does not overlap with the second wiring area 204. Opposite sides of the second covering portion 34 in the column direction Y are respectively connected with the second conductive connecting portions 221 of the common electrodes 22 of adjacent two rows of sub-pixels.

It should be understood that the second conductive connecting portions 221 of the common electrodes 22 of adjacent sub-pixels in the row direction X are connected. The second conductive connecting portion 221 may cover a part of the second wiring area 204. Although the second conductive connecting portion 221 of the common electrode 22 covers a part of the second wiring area 204 and may shield the scanning signal on the first scanning line 23, the coupling electric field existing between the sub-pixel electrode and the first scanning line 23 will lead to disorder of liquid crystal arrangement in the display process. Therefore, it is necessary to provide a black matrix 32 at the second wiring area 204 to perform shielding.

A metal line 30 may also be arranged on opposite sides of each sub-pixel in the row direction X, and the metal line 30 is arranged closer to the sub-pixel than the data line 25. The metal line 30 according to the embodiment of the present disclosure may be arranged in the same layer as the first common line 26 and connected with the first common line 26, and this metal line 30 may shield signals, so as to alleviate and eliminate the influence of the data signal and the scanning signal on the electric field at the sub-pixel area 200 and improve the display effect.

In an embodiment of the present disclosure, the scanning signal input terminal of the second scanning line 24, the common signal input terminal of the second common line 27 and the data signal input terminal of the data line 25 as mentioned above may be located on the same side of the first base 20. For example, the first base 20 has a first side and a second side which are oppositely arranged in the column direction Y. Each of the scanning signal input terminal of the second scanning line 24, the common signal input terminal of the second common line 27 and the data signal input terminal of the data line 25 is close to the first side or close to the second side, so that there is neither scanning signal input terminal of the second scanning line 24, common signal input terminal of the second common line 27, nor data signal input terminal of the data line 25 on other sides of the first base 20. Therefore, the other sides may be made to be narrower, so that a proportion of the display area A can be increased to realize a full-screen display.

It should be noted that, as shown in FIG. 3, an area B4 where a driving circuit of the gate 280 for providing the scanning signal for the second scanning line 24 is located may be located in the non-display area B, specifically, it may be located between a source electrostatic discharge area B2 and the fan-out area B3 and located inside the sealing area B1; however, it is not limited thereto, the driving circuit of the gate 280 for providing the scanning signal for the second scanning lines 24 may not be arranged on the first base 20, and may be electrically connected with the second scanning line 24 on the first base 20 through a flexible printed circuit board.

In addition, it should be noted that each of the via hole structures or the via hole portions mentioned in the present disclosure may be a structure in which a conductive material is filled in a hole.

The array substrate according to the embodiment of the present disclosure may further include a storage capacitor 31, and the storage capacitor 31 may include a first electrode plate 310 and a second electrode plate 311 opposite to each other in the thickness direction of the array substrate. The first electrode plate 310 may be arranged in the same layer and connected with the first common line 26, and the second electrode plate 311 may be arranged in the same layer as the first electrode 282 and the second electrode 283 of the transistor 28. The second electrode plate 311 may be connected with the second electrode 283 of the transistor 28. It should be noted that the first conductive connecting portion 211 of the sub-pixel electrode may be connected with the second electrode plate 311 through the fourth via hole structure K4, so as to realize the connection between the first conductive connecting portion 211 of the sub-pixel electrode and the second electrode 283 of the transistor 28.

Based on the foregoing contents, in the array substrate according to an embodiment of the present disclosure, the first sub-wiring area 201 is provided with two second scanning lines 24 and one data line 25, and the second sub-wiring area 202 is provided with one second scanning line 24, one second common line 27 and one data line 25. The third wiring area 203 is provided with one data line 25, and each first scanning line 23 is connected with two second scanning lines 24 through the first via hole structure K1. The array substrate may be used in a 4K 60 Hz display panel.

In the array substrate according to another embodiment of the present disclosure, the first sub-wiring area 201 is provided with two second scanning lines 24 and two data lines 25, and the second sub-wiring area 202 is provided with one second scanning line 24, one second common line 27 and two data lines 25. The third wiring area 203 is provided with two data lines 25, and each first scanning line 23 is connected with two second scanning lines 24 through the first via hole structure K1. The array substrate may be used in 4K 120 Hz or 8K 60 Hz display panel.

It should be noted that the aforementioned 4K and 8K refer to a resolution of the display panel, and the 60 Hz and 120 Hz refer to a refresh rate of the display panel.

An embodiment of the present disclosure also provides a display panel, which includes the array substrate described in any of the above embodiments. It should be understood that the display panel may be a liquid crystal panel, therefore, the display panel may also include an opposite substrate oppositely arranged to the array substrate, and liquid crystal molecules located between the opposite substrate and the array substrate.

Figure 11:
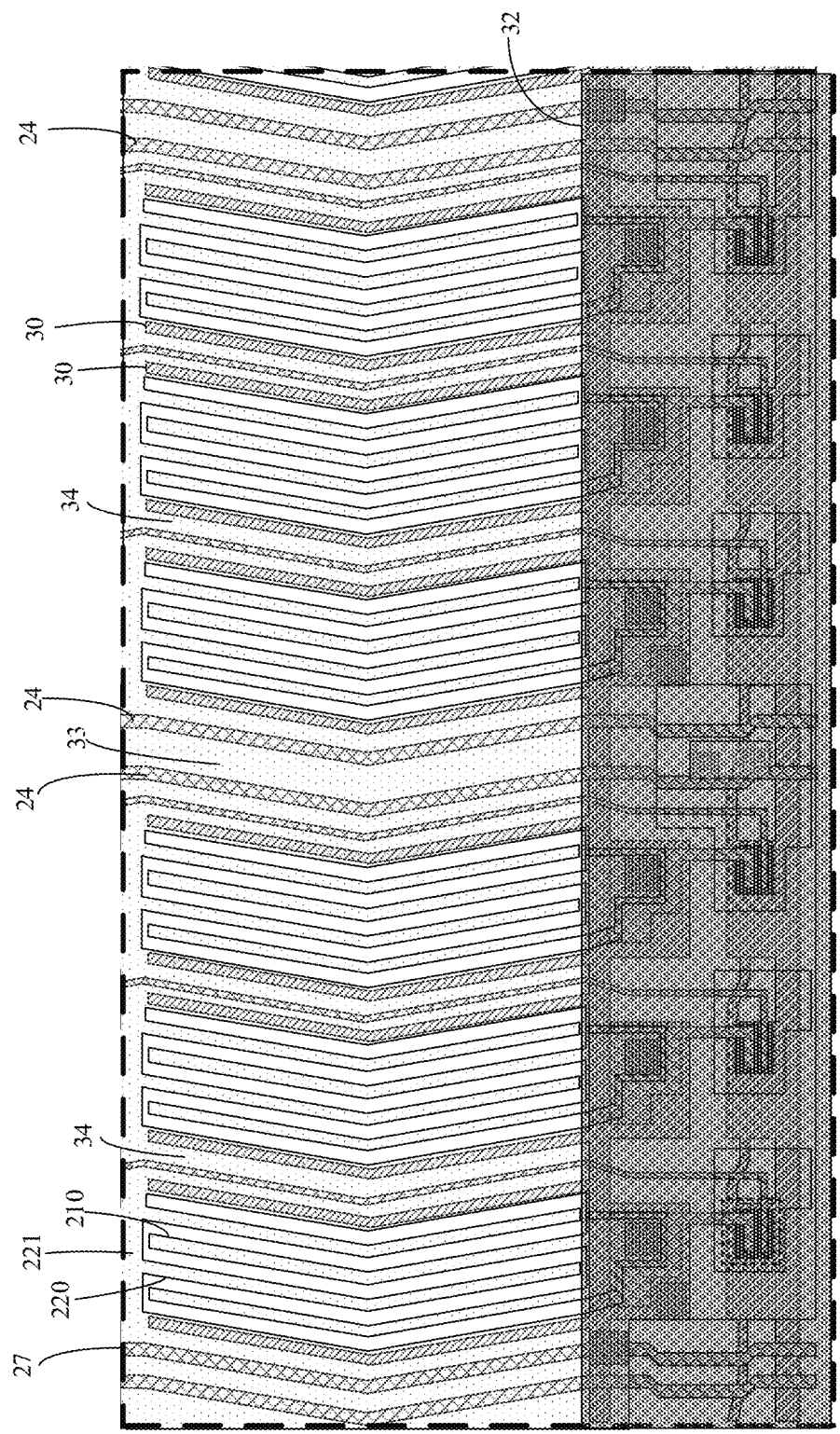
FIG. 11 is a schematic view of a positional relationship between the array substrate and a black matrix shown in FIG. 5.

When the array substrate has the aforementioned color filter layer, it is unnecessary to set the color filter layer in the opposite substrate. In this case, the opposite substrate may include a second base (not shown) and a black matrix 32 arranged at a side of the second base facing towards the array substrate, as shown in FIG. 11.

It should be understood that, when the array substrate does not have the aforementioned color filter layer, the color filter layer may be provided in the opposite substrate.

An embodiment of the present disclosure also provides an electronic device including the display panel as described above.

In the embodiment of the present disclosure, the specific type of the electronic device is not particularly limited, and any type of electronic device commonly used in this field may be used, such as a liquid crystal display television, a mobile phone, a computer, a watch, etc., and those skilled in the art may make corresponding choices according to the specific use of the electronic device, which will not be repeated in detail.

It should be noted that, the electronic device also includes other necessary parts and components in addition to the display panel. For example, the display may include, for example, a housing, a circuit board, a power cord, etc., which may be supplemented according to the specific use requirements of the electronic device, and will not be repeated herein.

In the present disclosure, unless otherwise specified, the term "arranged in the same layer" means that two layers, components, members, elements or parts can be formed by one same patterning process, and the two layers, components, members, elements or parts are generally formed of the same material.

In the present disclosure, unless otherwise specified, the expression "patterning process" generally includes steps of photoresist coating, exposure, development, etching, photoresist stripping, etc. The expression "one patterning process" means a process of forming a patterned layer, a component, a member, etc. using a mask plate.

The ordinal numbers such as "first", "second", "third" and "fourth" in the present specification are provided to avoid the confusion of constituent elements, rather than to limit the quantity.

In this specification, unless otherwise specified and limited, the terms "installation", "interconnection" and "connection" should be understood in a broad sense. For example, it may be a fixedly connection, a detachably connection or an integrally connection; or may be a mechanically connection or an electrically connection; or may be a directly connection, an indirectly connection through a middle member, or through a communication between inner portions of two elements. For those of ordinary skill in the art, the specific meanings of the above terms in the present disclosure can be understood according to the specific situations.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. An array substrate, comprising:
   a first base;
   a plurality of pixel units arrayed on the first base in a row direction and a column direction; each of the pixel units comprising at least two sub-pixels arranged in the row direction;
   a plurality of first scanning lines sequentially arranged on the first base in the column direction, at least one first scanning line being arranged at a side of each row of pixel units in the column direction, the first scanning lines being connected with the sub-pixels;
   a plurality of second scanning lines sequentially arranged on the first base in the row direction, at least one second scanning line being arranged at a side of each column of pixel units in the row direction;
   a plurality of data lines sequentially arranged on the first base in the row direction, the data line being connected with the sub-pixels, each of the data lines being arranged on at least one side of each column of sub-pixels in the row direction; and
   a plurality of first common lines sequentially arranged on the first base in the column direction, the first common lines being connected with the sub-pixels, and at least one of the first common lines being arranged at the side of each row of pixel units in the column direction, wherein:
   the second scanning line has a scanning signal input terminal and is connected with the first scanning line through a first via hole structure; and
   each of the sub-pixels comprises:
   a sub-pixel electrode having a plurality of first electrode strips arranged at intervals in the row direction;
   a common electrode arranged in the same layer as the sub-pixel electrode, the common electrode having a plurality of second electrode strips arranged at intervals in the row direction, the second electrode strips and the first electrode strips being arranged alternately in the row direction, and the common electrode being connected with the first common line through a second via hole structure; and
   a transistor comprising a gate, an active layer, a first electrode, and a second electrode arranged in the same layer, the gate being connected with the first scanning line, the first electrode being connected with an end of the active layer, the first electrode being connected with the data line, and the second electrode being connected with the other end of the active layer and connected with the sub-pixel electrode.

2. The array substrate according to claim 1, wherein the first via hole structure comprises a first via hole portion and a connecting portion, the connecting portion and the second scanning line are located in different layers of the array substrate, and a part of the connecting portion is connected with the first scanning line and a part of the connecting portion is connected with the second scanning line through the first via hole portion.

3. The array substrate according to claim 2, wherein the first via hole structure further comprises a second via hole portion; and
   wherein the connecting portion is arranged in the same layer as the common electrode and the sub-pixel electrode, and there is a gap between the connecting portion and the common electrode and the sub-pixel electrode; and the connecting portion is connected with the first scanning line through the second via hole portion.

4. The array substrate according to claim 3, wherein:
   the first scanning line is provided with a plurality of hollowed-out holes; and
   an orthographic projection of the second via hole portion on the first base partially overlaps with an orthographic projection of the first scanning line on the first base, and the orthographic projection of the second via hole portion on the first base partially overlaps with an orthographic projection of the hollowed-out hole on the first base.

5. The array substrate according to claim 1, wherein:
the first base has a plurality of pixel areas arrayed in the row direction and the column direction and a plurality of first wiring areas;
each of the pixel areas comprises at least two sub-pixel areas arranged at intervals in the row direction, the number of sub-pixel areas in each of the pixel areas is equal to the number of sub-pixels in each of the pixel units, and the first electrode strip and the second electrode strip in each of the sub-pixels are arranged on one sub-pixel area; and
the first wiring areas and columns of pixel areas are alternately arranged in the row direction, a part of the plurality of first wiring areas is a first sub-wiring area, and the other part thereof is a second sub-wiring area, one of the first sub-wiring area and the second sub-wiring area is provided with at least one second scanning line, and the other of the first sub-wiring area and the second sub-wiring area is provided with one second scanning line.

6. The array substrate according to claim 5, wherein:
each of the first sub-wiring areas is provided with two second scanning lines, and two second scanning lines on the same first sub-wiring area are respectively connected with different first scanning lines through the first via hole structure; and
each of the second sub-wiring areas is provided with one second scanning line.

7. The array substrate according to claim 6, wherein:
the array substrate also comprises a plurality of second common lines, and each of the second common lines is connected with the common electrode through a third via hole structure; and
the second sub-wiring area is provided with one second scanning line and one second common line.

8. The array substrate according to claim 7, wherein:
the first base has a plurality of second wiring areas, the second wiring areas and rows of pixel areas are alternately arranged in the column direction, and each of the second wiring areas is provided with one first scanning line and one first common line; and
the first scanning line in one row is connected with the gates of the transistors of the sub-pixels in the same row, and the first common line in one row is connected with the common electrodes of the sub-pixels of the same color in the same row through the second via hole structure.

9. The array substrate according to claim 8, wherein two second scanning lines are respectively connected with the same first scanning line through one first via hole structure.

10. The array substrate according to claim 9, wherein the plurality of first wiring areas are divided into a plurality of first wiring area groups, and each of the first wiring area groups comprises eight first wiring areas arranged sequentially in the row direction, a nth first wiring area in each of the first wiring area groups is formed into the first sub-wiring area, and the remaining seven first wiring areas are formed into the second sub-wiring area, where 1≤n≤8, and n is a positive integer.

11. The array substrate according to claim 7, wherein:
a width of the first sub-wiring area in the row direction is W1, a width of the second sub-wiring area in the row direction is W2, and a width of the sub-pixel area in the row direction is W3; and
$0 \leq (W1-W2)/(2 \times W3) \leq 4\%$, and W1, W2, and W3 are positive numbers.

12. The array substrate according to claim 11, wherein the width W1 of the first sub-wiring area is equal to the width W2 of the second sub-wiring area.

13. The array substrate according to claim 5, further comprising a first covering portion, wherein an orthographic projection of the first covering portion on the first base completely overlaps with the first wiring area located between two adjacent pixel areas, and the first covering portion is arranged in the same layer as and connected with the common electrode.

14. The array substrate according to claim 1, wherein one data line is arranged at a side of each column of sub-pixels in the row direction, the data lines and the columns of sub-pixels are alternately arranged in the row direction, each of the data lines is connected with the sub-pixels in the column of sub-pixels adjacent thereto.

15. The array substrate according to claim 1, wherein one data line is respectively provided on opposite sides of each column of sub-pixels in the row direction column, each of the sub-pixels in a first row in each column of sub-pixels is connected with one data line located at a side thereof and adjacent thereto, and each of the sub-pixels in a second row adjacent to the first row is connected with another data line located at the other side thereof and adjacent thereto.

16. The array substrate according to claim 1, wherein a width of the second scanning line in the row direction is larger than a width of the data line in the row direction.

17. The array substrate according to claim 16, wherein a ratio of the width of the second scanning line in the row direction to the width of the data line in the row direction is 1.1 to 2.

18. The array substrate according to claim 1, wherein:
each of the pixel units comprises three sub-pixels, which are respectively a red sub-pixel, a green sub-pixel and a blue sub-pixel arranged sequentially in the row direction; and
the red sub-pixel of one of two groups of pixel units adjacently arranged in the row direction is adjacent to the blue sub-pixel of the other group.

19. The array substrate according to claim 1, wherein the array substrate is a part of a display device.

20. A method, comprising:
providing an array substrate, wherein the array substrate comprises:
a first base;
a plurality of pixel units arrayed on the first base in a row direction and a column direction; each of the pixel units comprising at least two sub-pixels arranged in the row direction;
a plurality of first scanning lines sequentially arranged on the first base in the column direction, at least one first scanning line being arranged at a side of each row of pixel units in the column direction, the first scanning lines being connected with the sub-pixels;
a plurality of second scanning lines sequentially arranged on the first base in the row direction, at least one second scanning line being arranged at a side of each column of pixel units in the row direction;
a plurality of data lines sequentially arranged on the first base in the row direction, the data line being connected with the sub-pixels, each of the data lines being arranged on at least one side of each column of sub-pixels in the row direction; and
a plurality of first common lines sequentially arranged on the first base in the column direction, the first common lines being connected with the sub-pixels, and at least one of the first common lines being arranged at the side of each row of pixel units in the column direction, wherein:

the second scanning line has a scanning signal input terminal and is connected with the first scanning line through a first via hole structure; and each of the sub-pixels comprises:
- a sub-pixel electrode having a plurality of first electrode strips arranged at intervals in the row direction;
- a common electrode arranged in the same layer as the sub-pixel electrode, the common electrode having a plurality of second electrode strips arranged at intervals in the row direction, the second electrode strips and the first electrode strips being arranged alternately in the row direction, and the common electrode being connected with the first common line through a second via hole structure; and
- a transistor comprising a gate, an active layer, a first electrode, and a second electrode arranged in the same layer, the gate being connected with the first scanning line, the first electrode being connected with an end of the active layer, the first electrode being connected with the data line, and the second electrode being connected with the other end of the active layer and connected with the sub-pixel electrode.

* * * * *